United States Patent [19]

Hiiro

[11] Patent Number: 4,993,813
[45] Date of Patent: Feb. 19, 1991

[54] OPTICAL AMPLIFIER
[75] Inventor: Hiroyuki Hiiro, Kanagawa, Japan
[73] Assignee: Fuji Photo Film Co., Ltd., Kanagawa, Japan
[21] Appl. No.: 439,987
[22] Filed: Nov. 21, 1989
[30] Foreign Application Priority Data Nov. 21, 1988 [JP] Japan .................................. 63-293949

[51] Int. Cl.$^5$ ...................... H01S 3/098; G02B 27/28
[52] U.S. Cl. .................................... 350/401; 330/4.3; 350/403; 350/170; 372/27; 372/43; 372/105
[58] Field of Search ............... 350/401, 402, 167, 170, 350/400, 403; 330/4.3; 372/105, 19, 27, 49, 100, 43

[56] References Cited

U.S. PATENT DOCUMENTS

| | | | |
|---|---|---|---|
| 3,766,466 | 10/1973 | Faries et al. | 372/105 |
| 4,649,351 | 3/1987 | Veldkamp et al. | 330/4.3 |
| 4,686,485 | 8/1987 | Goldberg et al. | 330/4.3 |
| 4,757,268 | 7/1988 | Abrams et al. | 330/4.3 |
| 4,791,650 | 12/1988 | Tatsuno et al. | 350/401 |
| 4,813,762 | 3/1989 | Leger et al. | 350/167 |
| 4,822,151 | 4/1989 | Tatsuno et al. | 350/401 |
| 4,826,269 | 5/1989 | Streifer et al. | 350/167 |

Primary Examiner—Bruce Y. Arnold
Assistant Examiner—Martin Lerner
Attorney, Agent, or Firm—Sughrue, Mion, Zinn, Macpeak & Seas

[57] ABSTRACT

An optical amplifier includes a plurality of amplifiers which are disposed between a first reflective mirror and a second reflective mirror of an optical resonator arranged with the first reflecting mirror and the second reflecting mirror in face-to-face relationship and are adapted to amplify light through induced emission; and a beam combining and separating device which is adapted to combine the light made incident thereupon from the plurality of amplifiers and cause the light to emerge therefrom in the direction of the second reflecting mirror and is also adapted to separate the light from incident thereupon after being reflected by the second reflecting mirror and cause the light to emerge therefrom in the respective directions of the amplifiers. As the combination and separation of the light are repeatedly effected, a beam of light having high energy amplified by the amplifiers is obtained.

16 Claims, 5 Drawing Sheets

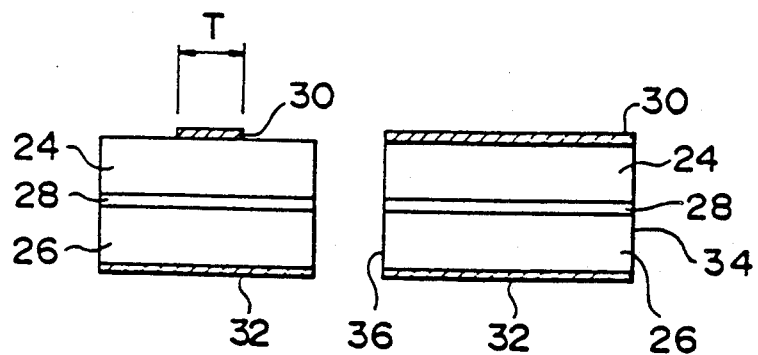

OPTICAL AMPLIFIER

BACKGROUND OF THE INVENTION:

1. Field of the Invention:

The present invention relates to an optical amplifier, and more particularly to an optical amplifier which is capable of emitting a beam of light having high energy and is suitably used as a light source for an optical recording apparatus for recording information such as a character on a recording medium.

2. Description of the Related Art:

As an apparatus for recording information such as a character on a recording material by means of a beam of light, a laser computer output microfilmer (lasercom) which directly records information such as a character on a recording material including a microfilm by effecting scanning with a laser beam on the basis of information outputted by a computer is known (Japanese Patent Laid-Open No. 67722/1975). This lasercom has an argon laser for oscillating a laser beam, an optical modulator for optically modulating the laser beam in response to the character information, a rotating polygon mirror for polarizing in the horizontal scanning direction the laser beam modulated by the optical modulator, and a galvanometer provided with a polarizing mirror for polarizing in the vertical scanning direction the light reflected from the rotating polygon mirror. The arrangement is such that the laser beam outputted from the optical modulator is used to effect two dimensional scanning on a recording material via a scanning lens by means of the rotating polygon mirror and the galvanometer, thereby recording information such as a character on the recording material.

With the above-described lasercom, however, since an argon laser which cannot be on-off controlled, an optical modulator and the like are necessary, a proposal has recently been made to use a semiconductor laser instead of the argon laser. As such semiconductor lasers, SDL-2410, SDL-2420 (brandnames of Spectra Diode Labs Inc.) Series and the like are available. With respect to laser beams emitted from laser oscillating regions of such a semiconductor laser, it is known that a phase difference exists, and that, when the phase difference between laser beams emitted from the laser beam oscillating regions is 180°, two lobes are formed in the direction along a surface of a p-n junction in a far field pattern. Accordingly, even if a semiconductor laser which forms these two lobes is used as a light source for recording on a recording material, the laser beam fails to focus into one spot, so that it is impossible to realize an optical system having a high degree of resolution. In particular, in cases where character information or the like is recorded with dots on a microfilm by using a laser beam, resolving power on the order of 3,360 dots/7.2 mm is required, so that it is necessary to effect recording with dots with a very high degree of accuracy, with the result that the aforementioned two lobes present a problem.

For this reason, a proposal has hitherto been made to use one lobe by cutting the other (Appl. Phys. Lett. 41 (12), Dec. 15, 1982). In addition, Japanese Patent Laid. Open No. 98320/1987 discloses an arrangement in which the two lobes are separated from each other after a laser beam is converted into a parallel bundle of rays, and the two lobes are then combined into one by using a reflecting mirror, a half-wave plate, and a polarized beam splitter.

However, with the aforementioned conventional optical system in which one lobe is cut, there is a problem in that since one half of the beam for forming a lobe is cut, the light intensity of the laser beam emitted in the direction along the surface of the p-n junction is reduced to one half or thereabouts, so that the efficiency is poor. Consequently, the application of this optical system is difficult with respect to a recording material which requires high energy in recording as in the case of a heat. mode recording material such as a laser direct recording film (LDF).

If the above-disclosed optical system in which the lobes are combined is used, it is difficult in practice to obtain a completely parallel bundle of rays, and if the optical path lengths of the individual separated lobes are not equal, the position of a beam waist at the time when the beam is focused by a final lens becomes offset from an optical axis, thereby making it difficult to effect focusing at a high energy density.

SUMMARY OF THE INVENTION:

Accordingly, an object of the present invention is to provide an optical amplifier which is capable of emitting a light beam having a high energy density, thereby overcoming the above-described drawbacks of the conventional art.

To this end, in accordance with the present invention, there is provided an optical amplifier in which, as shown in FIG. 3, between a first reflecting mirror A and a second reflecting mirror B of an optical resonator arranged with the first reflecting mirror A and the second reflecting mirror B having a smaller reflectivity than that of the first reflecting mirror A in face-to-face relationship, there are disposed a plurality of amplifying means $C_1$, $C_2$, . . . for amplifying light by means of induced emission and a beam combining and separating means D which is adapted to combine the light made incident thereupon from the respective amplifying means $C_1$, $C_2$, . . . and cause the light to emerge therefrom in the direction of the second reflecting mirror B and is also adapted to separate the light made incident thereupon after being reflected by the second reflecting mirror B and cause the light to emerge therefrom in the direction of the respective amplifying means $C_1$, $C_2$, . . .

In accordance with the present invention, light emitted from the plurality of amplifying means $C_1$, $C_2$. . . is made incident upon and combined by a beam combining and separating means D and is then made to emerge therefrom in the direction of the second reflecting mirror B so as to be reflected thereby. Since the path of the light is reversible, the light reflected by the second reflecting mirror B passes along a return path and, after being made incident upon the beam combining and separating means D and separated by a combined light emerging point thereof, the light is made emergent in the direction of the amplifying means $C_1$, $C_2$. . . . Then, after passing through the amplifying means, the light is reflected by the first reflecting mirror A. Accordingly, the light reciprocates between the first reflecting mirror A and the second reflecting mirror B, and if the period of this reciprocation is set at an integral multiple of the oscillating period of an optical wave, the phase of the oscillation when the light returns to its original position becomes identical, and standing waves are generated and the light is amplified by induced emission. During the initial period of oscillation of the light, light having various phases and planes of polarization disperse in all directions from various positions owing to natural emission. However, the greater the amplitude of the light, the greater the rate of induced emission, so that strong waves are amplified while weak waves are absorbed. Thus, the waves are gradually unified into those of one mode, and are ultimately emitted to the outside after being transmitted through the second reflecting mirror.

As described above, in accordance with the present invention, it is possible to obtain the advantage that a light beam of high energy can be obtained since the light amplified by the plurality of amplifying means is combined and output.

The above and other objects, features and advantages of the present invention will become more apparent from the following description of the invention when read in conjunction with the accompanying drawings.

BRIEF DESCRIPTION OF THE DRAWINGS:

FIGS. 5A and 5B are cross-sectional views of a light amplifier of the embodiment shown in FIG. 4.

Figure 1:
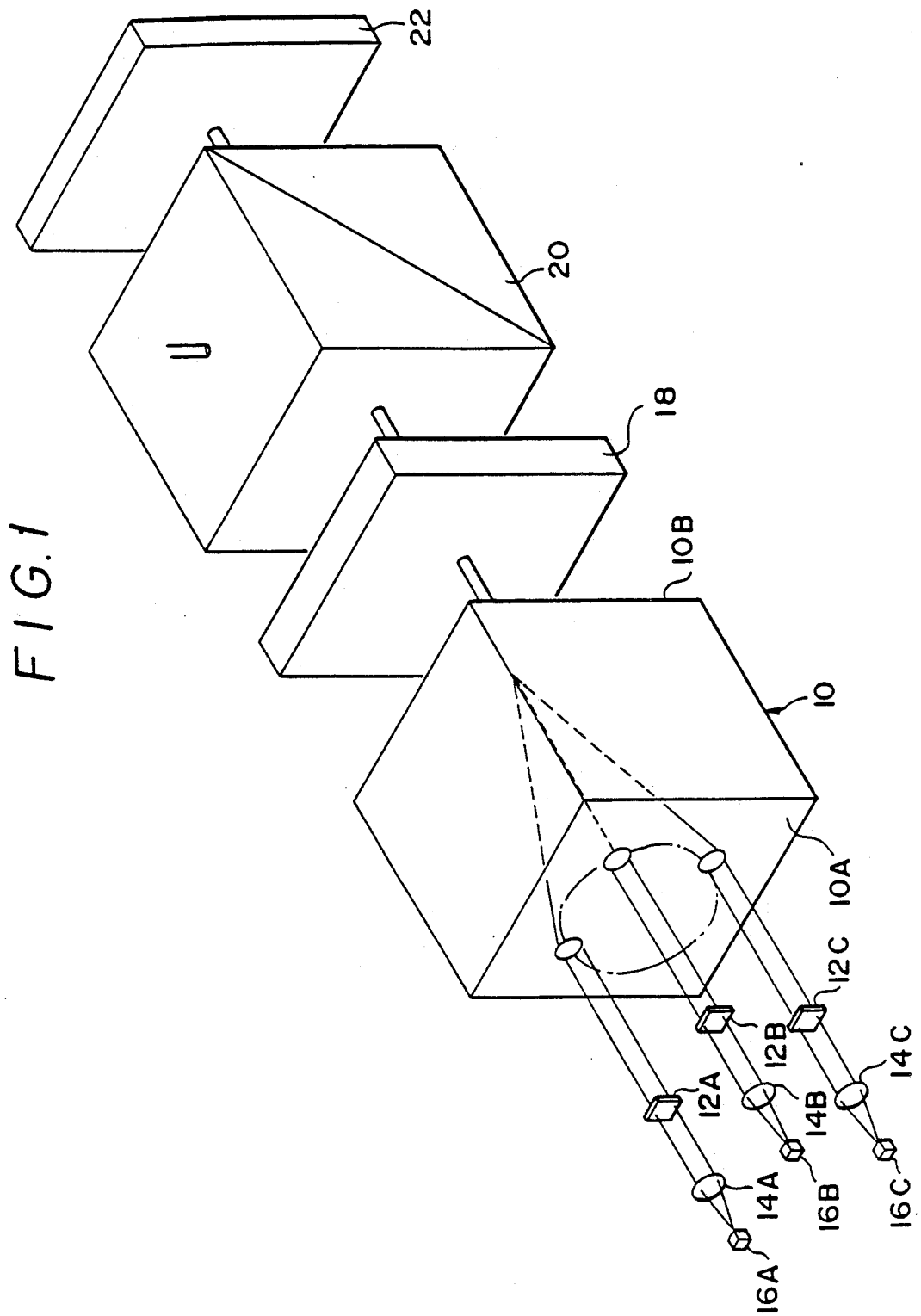
FIG. 1 is a perspective view of an embodiment of the present invention.
Figure 2:
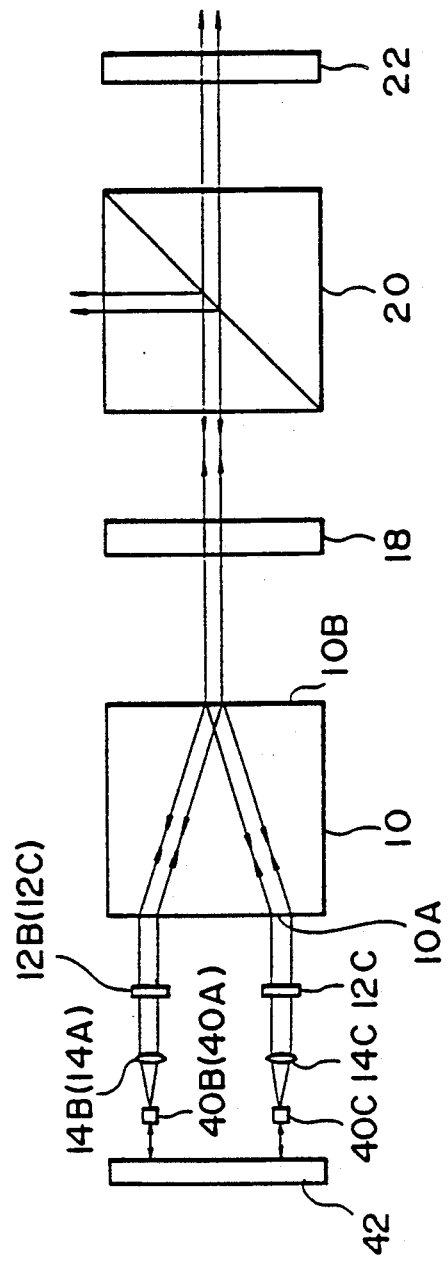
FIG. 2 is a side-elevational view of the embodiment.
Figure 3:
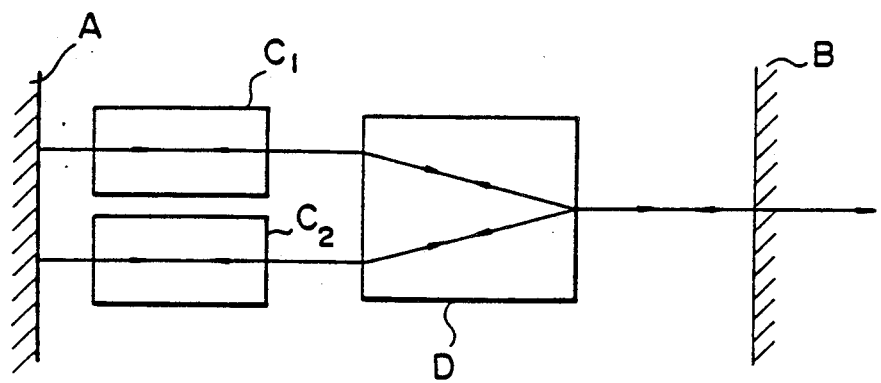
FIG. 3 is a block diagram explaining the present invention.

DESCRIPTION OF THE PREFERRED EMBODIMENTS:

Referring now to the accompanying drawings, a detailed description will be given of the preferred embodiments of the present invention. As shown in FIGS. 1 and 2, a biaxial crystal 10 having parallel planes 10A, 10B perpendicular to a Z-axis is disposed in such a manner that these parallel planes constitute planes of incidence and emergence. As such a biaxial crystal, it is possible to use tridimite ($SiO_2$), mica ($K_2O\ Al_2O_3.6SiO_2.2H_2O$), chrysoberyl ($BeAl_2O_4$), forsterite ($MgSi_2O_4$), aragonite ($CaO.CO_2$), fluorine type topaz ($Al_2SiO_4(F)_2$), gypsum ($CaO.SO_3.2H_2O$), or the like. These biaxial crystals have a property in which if light is made incident upon its plane perpendicular to the Z-axis, the incident light is refracted conically. In addition, it is also possible to use ADP ($NH_4\ H_2\ PO_4$) which displays conical refractiveness in an electric field.

Wave plates 12A, 12B 12C for correcting the phase of light, collimators 14A, 14B, 14C, and semiconductor lasers 16A, 16B, 16C each coated in such a manner that one specular surface thereof has a reflectivity of approximately 90% and the other specular surface thereof is nonreflective, are disposed in order on the side of a plane 10A of the biaxial crystal 10 corresponding to the bottom of a conical refraction, and are arranged in such a manner as to be aligned with the periphery of the bottom of the conical refraction. The angle of the plane of polarization of a laser beam emitted from each of these semiconductor lasers is determined in correspondence with the position of incidence of the laser beam upon the plane 10A of the biaxial crystal 10 such that the light combined by the biaxial crystal 10 becomes circularly polarized light.

A quarter wave plate 18, a polarized beam splitter 20 acting as a mode selector, and a second reflecting mirror 22 having a reflectivity of approximately 2-5% are arranged in order on the side of the plane 10B of the biaxial crystal 10 corresponding to an apex of the conical refraction. A junction plane of this polarized beam splitter 20 forms an angle of 45° with respect to an optical axis and allows only the laser beam polarized in a specific direction to pass therethrough in the direction of the second reflecting mirror 22. It should be noted that the specular surface of each of the semiconductor lasers having a reflectivity of approximately 90% serves as a first reflecting mirror, and this specular surface and the second reflecting mirror composes an optical resonator.

The operation of this embodiment will be described hereinunder. Laser beams emitted from the semiconductor lasers 16A, 16B, 16C are made incident upon the biaxial crystal 10 via the collimators 14A, 14B, 14C and the wave plates 12A, 12B, 12C. The laser beams made incident upon the biaxial crystal 10 are refracted conically and are then combined and made emergent from the plane 10B as circularly polarized light. This circularly polarized light passes through the quarter wave plate 18 so as to be converted to linearly polarized light, is then transmitted through the polarized beam splitter 20, and is made incident upon the second reflecting mirror 22. At this time, part of the laser beam is reflected by the junction plane of the polarized beam splitter 20, and only the laser beam polarized in a specific direction is transmitted through the polarized beam splitter 20. The laser beam thus transmitted through the polarized beam splitter 20 is reflected by the second reflecting mirror 22, passes through the same optical path as the forward path, and after being separated into linearly polarized light by the biaxial crystal 10 it is made incident upon the semiconductor lasers and is reflected by their specular surfaces. In this manner, the laser beam reciprocates between the specular surfaces of the semiconductor lasers and the second reflecting mirror, is amplified by the semiconductor lasers by means of induced emission, and is unified into waves of one mode by the polarized beam splitter. When the intensity of the laser beam reaches a predetermined level, the laser beam is transmitted through the second reflecting mirror and is thereby emitted to the outside.

Figure 4:
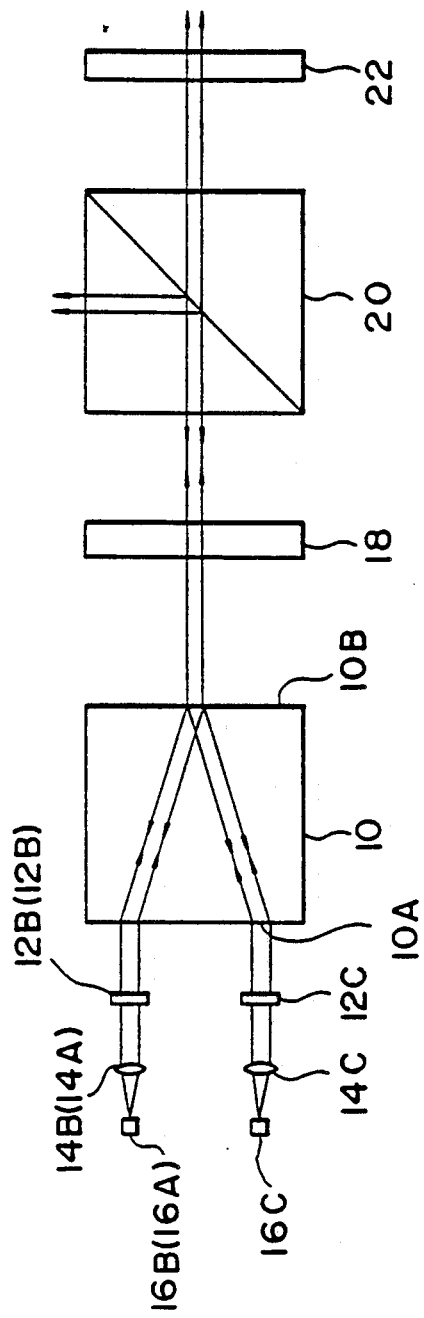
FIG. 4 is a side-elevational view of another embodiment of the present invention, corresponding to FIG. 2.

Referring now to FIG. 4, a description will be given of another embodiment of the present invention. In this embodiment, light amplifiers in which both specular surfaces of semiconductor lasers are coated so as to be nonreflective are used instead of the semiconductor lasers. As shown in FIGS. 5A and 5B, each of these light amplifiers is arranged as follows: An active region 28 is clamped by an n-type semiconductor region 24 and a p-type semiconductor region 26, and an anode 30 having a stripe width T is provided in the n-type semiconductor region 24, while a cathode 32 is provided in the p-type semiconductor region 26. Specular surfaces 34, 36 are coated so as to be nonreflective.

Light amplifiers 40A, 40B, 40C are arranged in the same positions as those of the semiconductor lasers 16A, 16B, 16C shown in FIGS. 1 and 2, and a first reflecting mirror 42 having a reflectivity of approximately 90% is disposed in such a manner as to oppose specular surfaces of the light amplifiers 40A, 40B, 40C. It should be noted that since in this embodiment the parts other than the first reflecting mirror and the light amplifiers are identical to those of the above-described embodiment, corresponding parts are denoted by the same reference numerals, and a description thereof will be omitted. In this embodiment as well, the laser beam is emitted in the same way as the above-described embodiment.

Also, since the wave plates 12A, 12B, 12C in these embodiments are used for correcting the phase, they can be omitted in cases where the correction of the phase is not necessary. In addition, the number of the semiconductor lasers is not restricted to the one mentioned above, and more than two or three semiconductor lasers can be provided, in which case a laser beam having energy corresponding to the number of the semiconductor lasers can be obtained. Furthermore, although a description has been given of an example in which a biaxial crystal is used as the beam combining and separating means, it is possible to use a Wollaston prism, a Rochon prism, a Sénarmont prism or the like in which two rectangular prisms of a uniaxial crystal are joined together and the incident light is separated into normal rays and abnormal rays. Moreover, although a description has been given of an example in which a polarized beam splitter is used as the beam selector, it is also possible to use an etalon or the like alternatively, or this beam selector may be omitted. Also, the present invention can be applied to a light source section for such as an optical disk, a thermal printer, or a laser printer.

What is claimed is:

1. An optical amplifier comprising:
   a plurality of amplifying means each having a first reflecting mirror and an amplifying portion for amplifying a beam of light through induced emission;
   a second reflecting mirror which is disposed in such a manner as to oppose said first reflecting mirrors with said amplifying portions placed therebetween and compose an optical resonator together with said first reflecting mirrors, said second reflecting mirror having a reflectivity smaller than that of said first reflecting mirror; and
   beam combining and separating means which is disposed between said amplifying portions and said second reflecting mirror and adapted to combine the light made incident thereupon from said plurality of amplifying means and cause the light to emerge therefrom in the direction of said second reflecting mirror and is also adapted to separate the light made incident thereupon after being reflected by said second reflecting mirror and cause the light to emerge therefrom in the respective directions of said plurality of amplifying means,
   whereby by repeating the combination and separation of the light by said beam combining and separating means and amplifying the light by said plurality of amplifying means, a beam of light having high energy is obtained.

2. An optical amplifier according to claim 1, wherein said amplifying means is constituted by a semiconductor laser whose specular surface on the side of said beam combining and separating means is coated so as to be nonreflective.

3. An optical amplifier according to claim 2, wherein said beam combining and separating means is constituted by a conically refractive substance which refracts incident light into a conical configuration before causing the light to emerge therefrom, said beam combining and separating means being arranged in such a manner that an apex of a conical refraction is opposed to said second reflecting mirror and a bottom of said conical refraction is opposed to said plurality of semiconductor lasers.

4. An optical amplifier according to claim 3, wherein each of said semiconductor lasers is arranged in such a manner that a nonreflective surface thereof corresponds to the periphery of the bottom of said conical refraction of said conically refractive substance, an angle of the plane of polarization of the light beam emitted from each of said semiconductor lasers being determined in correspondence with the position of incidence of the light beam upon said bottom of said conical refraction such that the light combined by said conically refractive substance becomes circularly polarized light.

5. An optical amplifier according to claim 1, wherein said beam combining and separating means is constituted by a conically refractive substance which refracts incident light into a conical configuration before causing the light to emerge therefrom, said beam combining and separating means being arranged in such a manner that an apex of a conical refraction is opposed to said second reflecting mirror and a bottom of said conical refraction is opposed to said plurality of amplifying means.

6. An optical amplifier according to claim 5, wherein said plurality of amplifying means are arranged in such a manner as to be aligned with a periphery of the bottom of said conical refraction such that the light made emergent from the apex of said conical refraction becomes circularly 7. An optical amplifier according to claim 6, further comprising:
   a quarter wave plate disposed on the second reflecting mirror side of said beam combining and separating means and adapted to convert a circularly polarized light beam made emergent from said beam combining and separating means into linearly polarized light; and
   a mode selector disposed on the second reflecting mirror side of said quarter wave plate and adapted to allow only the light beam in the plane of polarization in a specific direction to pass therethrough.

8. An optical amplifier according to claim 1, further comprising:
   a plurality of collimators disposed between said plurality of amplifying means and said beam combining and separating means in such a manner that foci are located in said amplifying portions of said plurality of amplifying means.

9. An optical amplifier according to claim 8, further comprising:
   a plurality of wave plates disposed between said collimators and said beam combining and separating means and adapted to correct the phase of light.

10. An optical amplifier comprising:
    a light resonator including a first reflecting mirror and a second reflecting mirror having a smaller reflectivity than that of said first reflecting mirror, said first reflecting mirror and said second reflecting mirror being arranged to oppose each other;
    a plurality of amplifying means disposed between said first reflecting mirror and said second reflecting mirror and adapted to amplify light through induced emission; and
    beam combining and separating means which is adapted to combine light made incident thereupon from said plurality of amplifying means and cause the light to emerge therefrom in the direction of said second reflecting mirror and is also adapted to separate the light made incident thereupon after being reflected by said second reflecting mirror and cause the light to emerge therefrom in the respective directions of said plurality of amplifying means, whereby by repeating the combination and separation of the light by said beam combining and separating means and amplifying the light by said plurality of amplifying means, a beam of light having high energy is obtained.

11. An optical amplifier according to claim 10, wherein said amplifying means is constituted by a light amplifier in which both specular surfaces of a semiconductor laser on the sides of said beam combining and separating means and said first reflecting mirror are coated so as to be nonreflective.

12. An optical amplifier according to claim 11, further comprising:
a plurality of collimators disposed between said plurality of amplifying means and said beam combining and separating means in such a manner that foci are located in said amplifying portions of said plurality of amplifying means.

13. An optical amplifier according to claim 12, wherein each of said semiconductor lasers is arranged in such a manner that a nonreflective surface thereof on the side of said conically refractive substance corresponds to the periphery of the bottom of said conical refraction of said conically refractive substance, an angle of the plane of polarization of the light beam emitted from each of light amplifiers being determined in correspondence with the position of incidence of the light beam upon said bottom of said conical refraction such that the light combined by said conically refractive substance becomes circularly polarized light.

14. An optical amplifier according to claim 10, wherein said beam combining and separating means is constituted by a conically refractive substance which refracts incident light into a conical configuration before causing the light to emerge therefrom, said beam combining and separating means being arranged in such a manner that an apex of a conical refraction is opposed to said second reflecting mirror and a bottom of said conical refraction is opposed to said plurality of amplifying means.

15. An optical amplifier according to claim 14, wherein said plurality of amplifying means are arranged in such a manner as to be aligned with a periphery of the bottom of said conical refraction such that the light made emergent from the apex of said conical refraction becomes circularly polarized light.

16. An optical amplifier according to claim 15, further comprising:
a quarter wave plate disposed on the second reflecting mirror side of said beam combining and separating means and adapted to convert a circularly polarized light beam made emergent from said beam combining and separating means into linearly polarized light; and
a mode selector disposed on the second reflecting mirror side of said quarter wave plate and adapted to allow only the light beam in the plane of polarization in a specific direction to pass therethrough.

* * * * *